United States Patent
Chang (10) Patent No.: US 9,960,013 B2
(45) Date of Patent: May 1, 2018

(54) CONTINUOUS WRITING OF PATTERN

(71) Applicant: Taiwan Semiconductor Manufacturing Company, Ltd., Hsin-Chu (TW)

(72) Inventor: Shih-Ming Chang, Hsinchu County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days. days.

(21) Appl. No.: 14/994,347

(22) Filed: Jan. 13, 2016

(65) Prior Publication Data
US 2017/0200584 A1    Jul. 13, 2017

(51) Int. Cl.
*H01J 37/317* (2006.01)
*H01L 21/027* (2006.01)
*G03F 7/20* (2006.01)

(52) U.S. Cl.
CPC ........ *H01J 37/3174* (2013.01); *G03F 7/2059* (2013.01); *H01L 21/0274* (2013.01); *H01L 21/0277* (2013.01); *H01L 21/0279* (2013.01); *H01J 2237/151* (2013.01); *H01J 2237/31716* (2013.01)

(58) Field of Classification Search
CPC .................................... H01J 37/3174
See application file for complete search history.

(56) References Cited

U.S. PATENT DOCUMENTS

| | | | | |
|---|---|---|---|---|
| 4,469,950 A | * | 9/1984 | Taylor | B82Y 10/00 250/398 |
| 4,698,509 A | * | 10/1987 | Wells | B82Y 10/00 250/398 |
| 5,030,836 A | * | 7/1991 | Kusui | G03F 7/704 250/492.2 |
| 6,372,391 B1 | * | 4/2002 | Wolfe | B82Y 10/00 430/296 |
| 6,429,440 B1 | * | 8/2002 | Bleeker | G03F 7/70058 250/492.1 |
| 8,464,186 B2 | | 6/2013 | Wang et al. | |
| 8,468,473 B1 | | 6/2013 | Wang et al. | |
| 8,473,877 B2 | | 6/2013 | Wang et al. | |
| 8,507,159 B2 | | 8/2013 | Wang et al. | |
| 8,510,687 B1 | | 8/2013 | Liu et al. | |
| 8,524,427 B2 | | 9/2013 | Shin et al. | |
| 8,530,121 B2 | | 9/2013 | Wang et al. | |
| 8,563,224 B1 | | 10/2013 | Chen et al. | |
| 8,584,057 B2 | | 11/2013 | Liu et al. | |

(Continued)

*Primary Examiner* — Jason McCormack
*Assistant Examiner* — Sean Luck
(74) *Attorney, Agent, or Firm* — Haynes and Boone, LLP (57) ABSTRACT

The present disclosure provides one embodiment of a method that includes slicing a first sub-polygon out of the pattern layout and writing the first sub-polygon onto the substrate using a beam with a first beam setting that is associated with the first sub-polygon. The method additional includes slicing a second sub-polygon out of the remaining pattern layout that does not include the first sub-polygon. The second sub-polygon interfaces with the first sub-polygon on at least one edge. Also, the method includes, without turning off the beam after writing the first sub-polygon onto the substrate, writing the second sub-polygon onto the substrate with a second beam setting that is associated with the second sub-polygon.

17 Claims, 5 Drawing Sheets

(56) References Cited

U.S. PATENT DOCUMENTS

| | | |
|---|---|---|
| 8,601,407 B2 | 12/2013 | Wang et al. |
| 8,609,308 B1 | 12/2013 | Chen et al. |
| 8,627,241 B2 | 1/2014 | Wang et al. |
| 8,677,511 B2 | 3/2014 | Wang et al. |
| 8,762,900 B2 | 6/2014 | Shin et al. |
| 8,822,106 B2 | 9/2014 | Wang et al. |
| 8,828,632 B2 | 9/2014 | Wang et al. |
| 8,835,082 B2 | 9/2014 | Chen et al. |
| 8,841,049 B2 | 9/2014 | Wang et al. |
| 8,846,278 B2 | 9/2014 | Shin et al. |
| 2004/0089822 A1* | 5/2004 | Ogasawara ............ B82Y 10/00 250/492.22 |
| 2009/0224180 A1* | 9/2009 | Aigner .................. B82Y 10/00 250/492.22 |
| 2011/0049383 A1* | 3/2011 | Wan ........................ C23C 14/04 250/423 R |
| 2014/0224986 A1* | 8/2014 | Shibahara .............. G01B 15/04 250/307 |
| 2014/0282304 A1* | 9/2014 | Jacques .................... G03F 1/78 716/55 |

\* cited by examiner

CONTINUOUS WRITING OF PATTERN

BACKGROUND

The semiconductor integrated circuit (IC) industry has experienced exponential growth. Technological advances in IC design and material have produced generations of ICs where each generation has scaled down to smaller and more complex circuits than the previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. For example, improvements to the IC design layout are needed.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods and systems for manufacturing semiconductor devices, and more particularly to methods and systems for writing a design layout on a photomask and/or directly a wafer using an energized beam to transfer a pattern (of a design layout) on a photomask and/or a wafer. Among a variety of energized beams being used to transfer a pattern, an electron-beam (e-beam) is used to reach such a goal. Using such an e-beam in a lithography process is generally referred to as e-beam lithography. In e-beam lithography, an e-beam is directed at a target material (e.g., a photomask or a wafer) coated with a photosensitive material to write a desired pattern on the target material. Another example wherein an e-beam is used to transfer a pattern is a process generally referred as, Electron Beam-Induced Deposition (EBID). It is a process of decomposing gaseous molecules in a reaction chamber by using an energized electron beam to deposit non-volatile fragments onto a work piece (e.g., a wafer and/or a photomask). Yet in another example, Electron Beam-Induced Etching (EBIE) is a process that utilizes an e-beam to transfer a pattern. It is a process of using a gaseous reactor in a reaction chamber that is energized by an electron beam such that etching a surface of a work piece (e.g., a wafer and/or a photomask). Similarly, Focused Ion Beam (FIB) can also induce the deposition and etching processes. Conventionally, while the e-beam is directed to the target material, such an e-beam produces a small diameter spot in a Gaussian beam writer. In a Variable Shaped Beam (VSB) writer, the e-beam is confined by two or more stencil aperture through the beam path. Therefore, the beam is shaped to a desired contour, which is generally referred to as a "shot." Such a shot is alternatively being turned on/off by a blanker. The alternative on and off of the e-beam is referred to as "stop." Together with the shot, a sub-unit of a pattern may be transferred to a target material using such a shot-and-stop process. The shot-and-stop process may result from that the writer needs pause time between two shots. For a raster writer, such as Gaussian beam writer, the pause time is necessary to separate shots located in different positions. For a VSB writer, the pause time is use to move the beam position and to change the beam shape. However, such "discontinuous" shot-and-stop process disadvantageously increases energy consumption and/or increases time needed to write a pattern on a target material. Moreover, the discontinuity of the e-beam may affect fidelity of a written pattern. Thus, the present disclosure provides systems and methods to improve both the pattern fidelity and the manufacturability of ICs in terms of transferring a pattern. Embodiments of the present disclosure generally provide benefits to mask fabrication facilities, as well as to IC manufacturers who use maskless photolithography (e.g., e-beam lithography). Although the following discussion is directed to using an e-beam to transfer a pattern on a target material, the presently disclosed systems and methods may be generalized to any kind of systems/methods that are used to transfer a pattern on a target material and thereby fall within the scope of the present disclosure.

Figure 1:
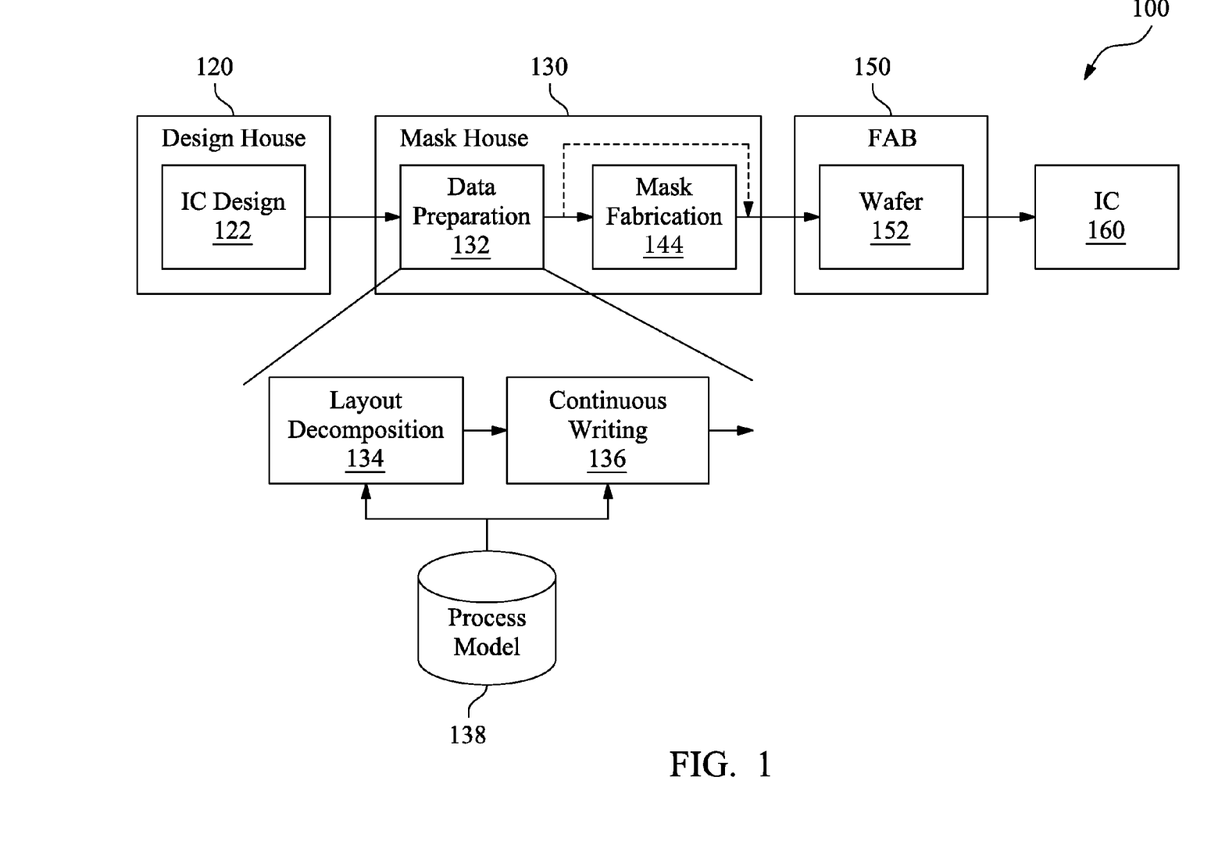
FIG. 1 is a simplified block diagram of an embodiment of an integrated circuit (IC) manufacturing system and an associated IC manufacturing flow.

FIG. 1 is a simplified block diagram of an embodiment of an integrated circuit (IC) manufacturing system 100 and an IC manufacturing flow associated with the IC manufacturing system. The IC manufacturing system 100 may benefit from one or more aspects of the present disclosure. The IC manufacturing system 100 includes a plurality of entities, such as a design house (or design team) 120, a mask house (or mask team) 130, and an IC manufacturer (or fab) 150, that interact with one another in the design, development, and manufacturing cycles and/or services related to manufacturing an integrated circuit (IC) device 160. The plurality of entities are connected by a communications network, which may be a single network or a variety of different networks, such as a private intranet and/or the Internet, and may include wired and/or wireless communication channels. Each entity may interact with other entities and may provide services to and/or receive services from the other entities. One or more of the design house 120, the mask house 130, and the fab 150 may be owned by a single company, and may even coexist in a common facility and use common resources.

The design house 120 generates an IC design layout 122, also referred to as a target layout 122 in the present disclosure. The target layout 122 includes various geometrical patterns designed for an IC product, based on a specification of the IC product to be manufactured. The geometrical patterns correspond to patterns of metal, oxide, or semiconductor layers that make up the various components of the IC device 160 to be fabricated. The various layers combine to form various IC features. For example, a portion of the target layout 122 includes various IC features, such as an active region, gate electrode, source and drain, metal lines and/or vias of an interlayer interconnection, and openings for bonding pads, to be formed in a semiconductor substrate (such as a silicon wafer) and/or various material layers disposed on the semiconductor substrate. The target layout 122 is presented in one or more data files having information of the geometrical patterns. For example, the target layout 122 can be expressed in a GDSII file format or DFII file format. Detailed embodiments of the target layout and further processing on the target layout are provided below with respect to FIGS. 4A-B and 5A-B.

Referring still to FIG. 1, the mask house 130 uses the target layout 122 to fabricate one or more masks to be used for manufacturing the various layers of the IC device 160. The mask house 130 performs various tasks, including a data preparation 132 and, optionally, a mask fabrication 144. In the data preparation 132, the target layout 122 is translated into a form that can be physically written by a mask writer. In the mask fabrication 144, the design layout as prepared is modified to comply with a particular mask manufacturer and is then fabricated. In the present embodiment, the data preparation 132 and the mask fabrication 144 are illustrated as separate elements. However, they can be collectively referred to as mask data preparation. In an embodiment, the IC manufacturing system 100 may employ a maskless lithography technology, such as e-beam lithography or optical maskless lithography. In such a system, the mask fabrication 144 is bypassed, and the data preparation 132 makes the target layout 122 suitable for wafer handling with the particular maskless lithography technology.

The data preparation 132 includes layout decomposition 134. In an embodiment, the layout decomposition 134 utilizes an approach to decompose the target layout 122 in a dynamical manner. For example, depending on the design of the layout 122, the target layout 122 may be decomposed into a plurality of sub-polygons and/or curvilinear sub-sectors in which each of the plurality of sub-polygons and/or curvilinear sub-sectors have a respective shape and/or size. By "sub-polygons", it is meant a geometrical pattern that may be in a shape of: a rectangle, a trapezoid, a triangle, a pentagon, a hexagon, a heptagon, an octagon, a nonagon, or any variety of two-dimensional shapes with straight side(s). By "curvilinear subsectors", it is meant that a geometrical pattern that is defined by one or more curved lines. By way of example, and not by limitation, a curvilinear sector may include shapes such as a circle, a sector (i.e., part of a circle), a circular segment, or any variety of two-dimensional shapes with curved side(s).

The data preparation 132 further includes continuous writing 136 that optimizes a setting for an exposure unit that is used to write/transfer the target layout 122 on a target material. In some embodiments, the setting may include a plurality of writing instructions, such as dosage of an energized beam of the exposure unit, a moving velocity of the energized beam and/or corresponding equipment to deflect/move the energized beam, and/or a moving direction of the beam and/or corresponding equipment to deflect/move the energized beam. Details of the layout decomposition 134 and the continuous writing 136 are provided below with respect to method 300 shown in FIG. 3.

When performing the tasks in the layout decomposition 134 and the continuous writing 136, a process model 138 may be used to run various simulations. The process model 138 may be based on actual processing parameters of the fab 150. The processing parameters can include parameters associated with various processes of the IC manufacturing cycle, parameters associated with tools used for manufacturing the IC, and/or other aspects of the manufacturing process. The process model 138 takes into account various process performance factors, such as intensity log slope (ILS), depth of focus (DOF), mask error enhancement factor (MEEF), data error enhancement factor (DEEF) in a maskless lithography, critical dimension (CD) variation budget, overlay budget, rules on minimal area, minimal CD, and minimal spacing, other suitable factors, or combinations thereof.

In embodiments, the data preparation 132 further includes optical proximity correction (OPC) (not shown). The OPC uses lithography enhancement techniques to compensate for image errors, such as those that can arise from diffraction, interference, and/or other process effects. The OPC may add assist features, such as scattering bars, serif, and/or hammerheads to the IC design layout 122 according to optical models and/or rules such that, after a lithography process, a final pattern on a wafer is improved with enhanced resolution and precision. The OPC may employ model-based correction or rule-based correction. The Data preparation 132 may include further resolution enhancement techniques (RET), such as off-axis illumination, sub-resolution assist features, phase-shifting masks, other suitable techniques, or combinations thereof.

It should be understood that the above description of the data preparation 132 has been simplified for the purposes of clarity, and the data preparation 132 may include additional features such as a logic operation (LOP) to modify the IC design layout 122 according to manufacturing rules. Additionally, the processes applied to the IC design layout 122 during data preparation 132 may be executed in a variety of different orders.

After the data preparation 132 modifies the IC design layout 122, the results are stored in one or more data files, such as a file in a GDSII file format or DFII file format. The one or more data files include information of geometrical patterns, such as polygons representing main design patterns and/or assist features. The data files are handed over to the mask fabrication 144, or directly to the fab 150 in a maskless lithography process. At the mask fabrication 144, a mask or a group of masks are fabricated based on the modified IC design layout. For example, an electron-beam (e-beam) or a mechanism of multiple e-beams is used to form a pattern on a mask (photomask or reticle) based on the modified IC design layout. The mask can be formed in various technologies. In an embodiment, a mask pattern includes opaque regions and transparent regions. A radiation beam, such as an ultraviolet (UV) beam, used to expose the image sensitive material layer (e.g., photoresist) coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM as known in the art. In an embodiment, the mask is an extreme ultraviolet (EUV) mask which is a reflective mask in that some portions of its top surface reflect radiation projected thereon in forming an aerial image of IC patterns to be printed on a target, such as the wafer 152. The EUV mask may incorporate resolution enhancement techniques such as phase-shifting mask (PSM) and/or optical proximity correction (OPC).

The fab 150, such as a semiconductor foundry, uses the mask (or masks) fabricated by the mask house 130 to manufacture the IC device 160. Alternatively, the fab 150 may use data prepared by the mask house 130 to manufacture the IC device 160 using some maskless lithography technology, such as electron beam direct write (EBDW) lithography. The mask may be used in a variety of processes. For example, the mask may be used in an ion implantation process to form various doped regions in the semiconductor wafer, in an etching process to form various etching regions in the semiconductor wafer, and/or other suitable processes.

The fab 150 is an IC fabricator that can include a myriad of manufacturing facilities for the fabrication of a variety of different IC products. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business. In the present embodiment, a semiconductor wafer 152 is manufactured to form the IC device 160 using one or more lithography processes such as deep ultraviolet (DUV) lithography, immersion lithography, extreme ultraviolet (EUV) lithography, electron beam lithography, x-ray lithography, ion beam lithography, and other suitable lithography techniques.

The semiconductor wafer 152 includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer 152 may further include various doped regions, dielectric features, and multilevel interconnects (formed at subsequent manufacturing steps).

Figure 2:
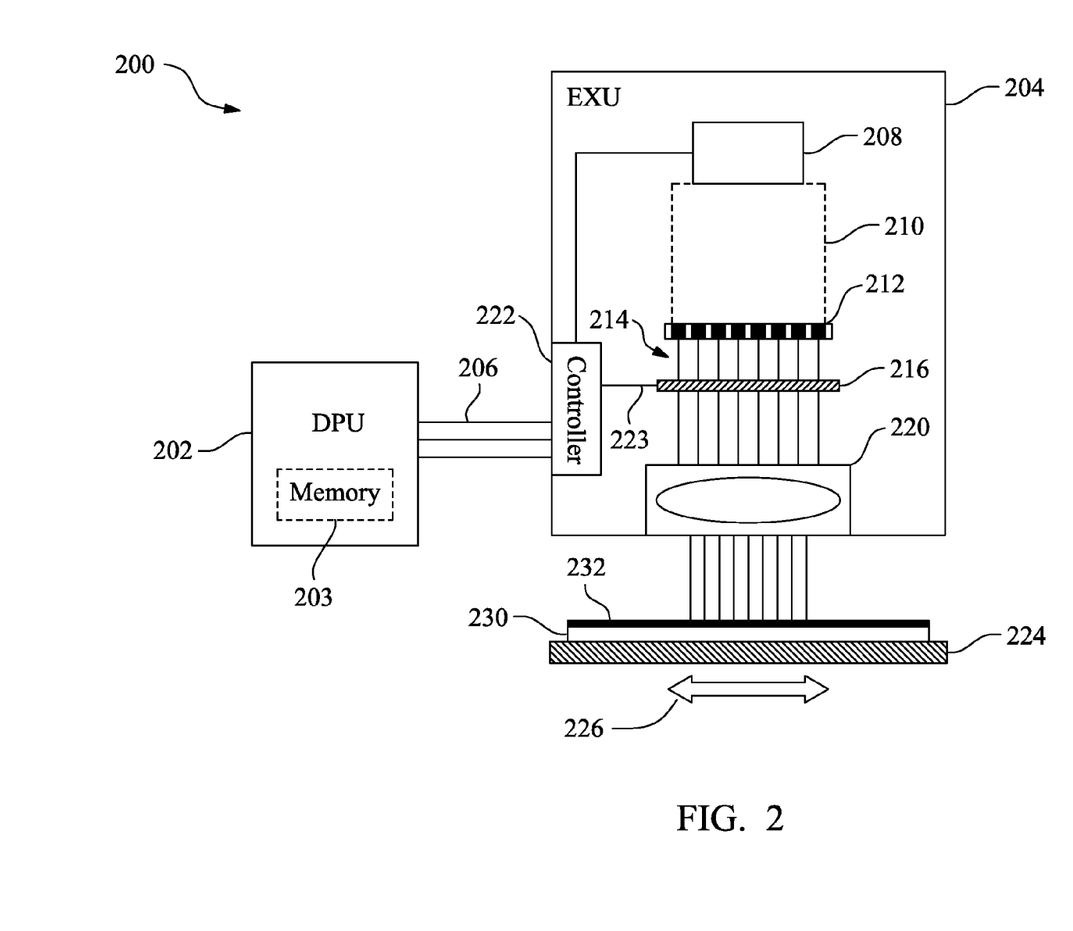
FIG. 2 is a system to write an integrated circuit (IC) design layout onto a substrate in accordance with various embodiments.

Referring to FIG. 2, illustrated is a diagrammatic view of an exemplary embodiment of a system 200 that is used to write the target layout 122 on a target material in accordance with the various embodiments. The system 200 includes a data processing unit 202 (DPU) and an exposure unit 204 (EXU). The DPU 202 is configured to read patterning data from a data storage medium (i.e. a non-volatile data storage medium), which may be within the DPU 202 or remotely positioned and in communication with the DPU 202. The DPU 202 obtains the patterning data and loads it into its memory 203. In some embodiments, the DPU 202 may include a pattern generator that processes the patterning data (e.g., decomposing a design layout) using the layout decomposition 134 and generates a pattern writing instructions using the continuous writing 136 as mentioned above. The DPU 202 sends the writing instruction(s) to the EXU 204. Additionally, the DPU 202 may also perform proximity correction and transformation to the writing instruction for the EXU 204. Alternatively, the proximity correction and transformation may optionally be performed separately by a standalone module. The writing instructions are preferably sent on one or more optical fibers 206 using light radiation as carriers of the information as will be discussed later herein.

The EXU 204 includes a source 208 that is configured to generate at least one energized beam 210, such as a photon beam, electron beam, and/or ion beam. The beam 210 may pass through one or more lenses (not shown) and may be focused to a beam aperture portion 212. In some embodiments, the beam aperture portion 212 may be comprised of a plurality of apertures or openings as to split the beam 210 into a plurality of beams 214. The number of beams 214 may vary depending on the design requirements of the system 200. The plurality of beams 214 may travel to a beam controller 216 that is configured to allow one or more of the beams to pass through to an imaging head 220, and/or to block/blank one or more of the beams 214 from passing through to the imaging head. The imaging head 220 includes an electron optical system for focusing the beams that are allowed to pass through. The beam controller 216 may include a plurality of deflectors (also referred to as blankers) that are controlled by electrical control signals that are associated with the writing instructions sent from the DPU 202. In some embodiments, the beam controller 216 may be controlled in accordance with the continuous writing 136 being executed by the DPU 202. When the deflector is not energized, the corresponding beam is allowed to pass through to the imaging head 220. When the deflector is energized, an electrical field is generated that deflects the corresponding beam such that the beam is blocked from passing through to the imaging head 220. In the present embodiment, the DPU 202 may remain deactivating the deflector (i.e., the deflector is kept being not energized) during writing a single pattern. That is, while writing a single pattern, the shot-and-stop process is advantageously avoided.

The EXU 204 may further include a controller 222 that receives the writing instructions and/or executed instructions from the DPU 202 via the optical fibers 206 (or communication path). In some embodiments, the writing instructions and the executed instructions may be associated with the continuous writing 136. Accordingly, the controller 222 may be configured to control the beam controller 216 based on the continuous writing 136. Further, the controller 222 may be configured to control the beam source 208 and/or 210 as well such as for example, a dosage of the beam. The writing instructions are sent using light radiation as carriers of the information. Accordingly, the controller 222 includes a plurality of light-to-electrical converters, such as photodiodes, that convert the light signals (e.g., writing instructions) into electrical control signals which are used to control 223 the deflectors of the beam controller 216 as discussed above. The system 200 further includes a stage 224 that is configured to move 226 in various directions (e.g. x-axis, y-axis, and/or z-axis). The stage 224 may hold and secure a target material 230 (e.g., a wafer or a photomask) by a vacuum system or other suitable securing mechanism. Examples of the target material 230 being implemented as a wafer may include a semiconductor substrate, a mask blank, a glass substrate, and a flat panel substrate. The target material 230 includes a recording medium 232 (or photo sensitive material), such as a photoresist, formed thereon. During processing, in some embodiments, the wafer 230 is moved and/or scanned relative to the imaging head 220 and in cooperation with the controller 222. In some alternative embodiments, without moving the wafer 230 (i.e., the wafer 230 is held steady), the deflector 216 may be used to deflect/direct the beams 214, through the imaging head 220, onto the wafer 230. The beams 214 that pass through to the imaging head 220 are focused, by the electron optical system, onto the recording medium 232 such that the desired pattern is written directly into the recording medium (without a photomask or reticle). After the entire target material 230 has been scanned, the recording medium 232 is developed to form the desired pattern (e.g., design layout 122) over the target material 230, and other processing, such as etching and doping, may be performed using the patterned recording medium. It is understood that the system 200 may include other components such as an alignment system and collimator, but is simplified for a better understanding of the disclosed embodiments herein.

Figure 3:
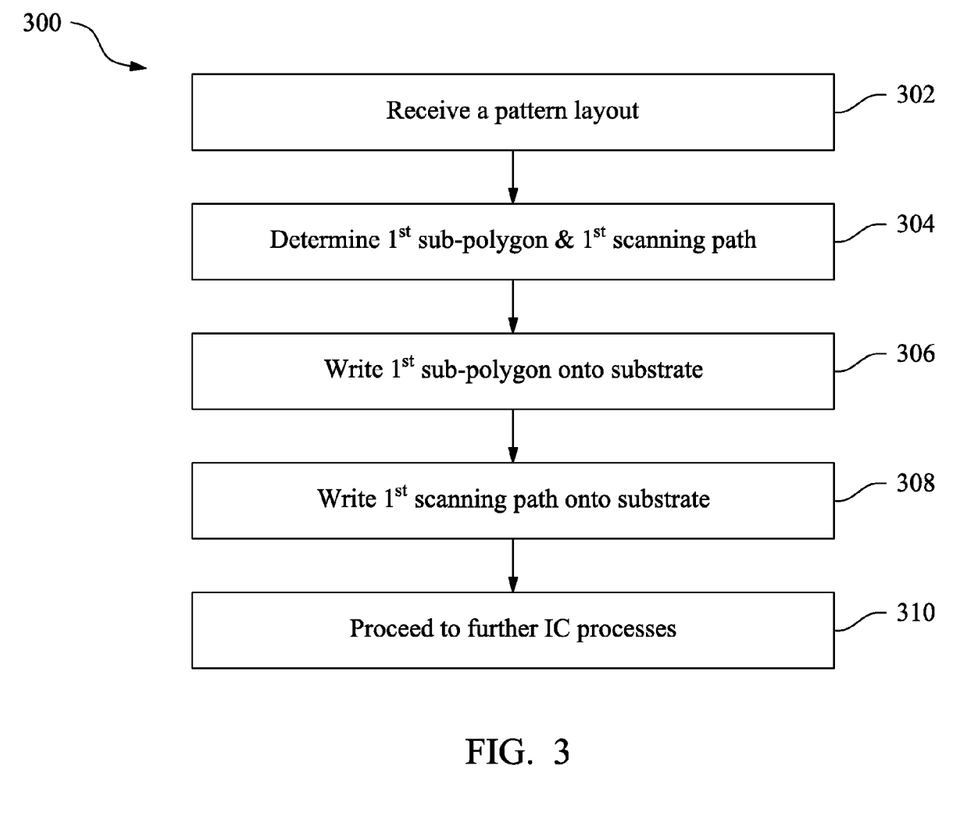
FIG. 3 is a flowchart of an embodiment of an integrated circuit (IC) method constructed in accordance with some embodiments.

FIG. 3 is a flowchart of method 300 to write an IC design layout (e.g., design layout 122) on a substrate according to various aspects of the present disclosure. In the following discussion, the method 300 will be described in conjunction with FIGS. 1 and 2. In one embodiment, the method 300 may be implemented in the data preparation 132 and the mask fabrication 140 of mask house 130 shown in FIG. 1. In another embodiment, the method 300 may be implemented without a presence of the mask fabrication 140, which means that, after the data preparation 132, the IC design layout 122 may be directly transferred to the wafer 152 using a variety of manners such as for example, e-beam lithography. Further, the method 300 in FIG. 3 is merely an overview and details associated with each step in the method will be described in association with the subsequent figures in the present disclosure.

The method 300 begins at step 302 in which the DPU 202 receives the IC design layout 122. The IC design layout 122 is presented in one or more data files having the information of the geometrical patterns. In one example, the IC design layout is expressed in a GDS file format. In alternative embodiments, the IC design layout may be transmitted between the components in IC manufacturing system 100 in alternate file formats such as DFII, CIF, OASIS, and/or any other suitable file type. The IC design layout includes various geometrical patterns representing features of an integrated circuit. For example, the IC design layout may include a plurality of main features such as active regions, gate electrodes, sources and drains, metal lines, interlayer interconnection vias, openings for bonding pads that may be formed in a semiconductor substrate (such as a silicon wafer) and/or various material layers disposed over the semiconductor substrate. The IC design layout may also include a background region without main features. The IC design layout may also include certain assist features, such as those features for imaging effect, processing enhancement, and/or mask identification information.

Usually, an optical proximity correction process (OPC) is applied to the IC design layout 122 to compensate for distortions caused by diffraction of radiation that occurs during the use of the lithography tools. The OPC process may include applying features that will alter the photomask, such as adding sub-resolution features to the photomask that interact with the original patterns in the physical design, adding features to the original patterns such as "serifs," adding jogs to features in the original pattern, modifying main feature pattern shapes or edges, and/or other enhancements. As process nodes shrink, OPC processes and the resultant patterns become more complex. Although existing OPC processes have been generally adequate for their intended purposes, they have not been entirely satisfactory in all respects. For example, one type of advanced OPC process is inverse lithography technology (ILT). ILT includes simulating the optical lithography process in the reverse direction, using the desired pattern on the substrate as an input to the simulations. The ILT process may produce complex, non-linear patterns that can be difficult, time consuming, and/or costly to form on a photomask or reticle. For another example, another type of advanced OPC process is adding scattering bars (SBs) to the IC design layout, but doing so induces focus shifting. The present disclosure provides an OPC process that includes inserting SBs with an arrangement that reduces focus shifting in comparison to previous attempts involving the insertion of SBs.

Referring back to FIG. 3, the method 300 proceeds to step 304 where the DPU 202, using the layout decomposition 134, determines a first sub-polygon and a first scanning path according to the pattern layout 122. In an alternative embodiment, depending on the pattern layout 122, the DPU 202 may be configured to determine a first sub-unit (e.g., the first sub-polygon) has a curvilinear-based shape and further determine a corresponding scanning path. By way of example, and not by limitation, a curvilinear-based shape is meant a geometrical pattern that is defined by one or more curved lines and may include shapes such as a circle, a sector (i.e., part of a circle), a circular segment, or any variety of two-dimensional shapes with curved side(s).

The method 300 then proceeds to step 306 in which the EXU 204 start to write the first sub-polygon and subsequently to step 308 in which the EXU 204 writes the first scanning path on the target material 224. In a specific and a non-limiting embodiment, the EXU 204 may write the first sub-polygon and subsequently the first scanning path by using/executing the continuous writing 136. More specifically, the DPU 202 is configured to execute the continuous writing 136 so as to cause the controller 222 and/or the EXU 204 as a whole to perform a variety of actions, such as controlling a dosage of the energized beam 208/210, a moving velocity of the beam controller/deflector 216, and a moving direction of the beam controller/deflector 216. In some embodiments, between the steps 306 and 308, the energized beam 208 remains turned on so that the conventional shot-and-stop process of the energized beam is avoided.

Additional steps can be provided before, during, and after the method 300, and some of the steps described can be replaced, eliminated, or moved around for additional embodiments of the method 300. After the first sub-polygon and the first scanning path has been written on the target material 232 and/or 230, the method 300 may proceed to further IC process stages (step 310). For example, further IC process stages at step 310 include determining a second sub-polygon and a second scanning path and subsequently writing the second sub-polygon and the second scanning path on the target material.

Figure 4A:
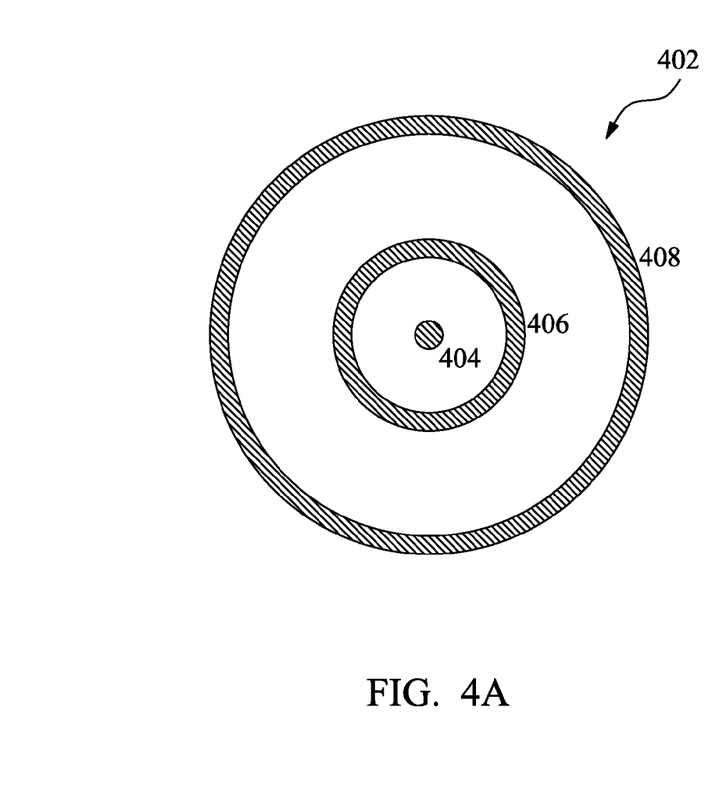
FIGS. 4A and 4B illustrate an integrated circuit (IC) design layout constructed in accordance with some embodiments.
Figure 4B:
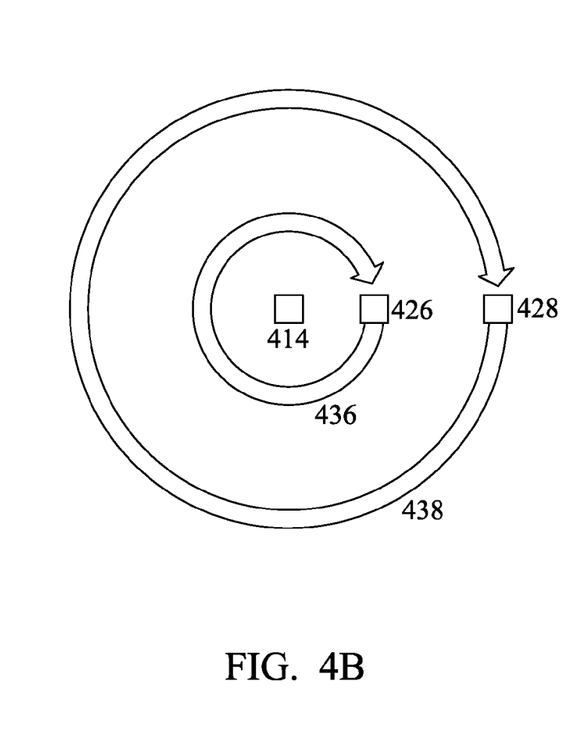

Referring to FIGS. 4A-B, an exemplary design layout 402 received by the DPU 202 and an approach to writing the design layout 402 on a target material are provided in accordance with various embodiments. As shown in FIG. 4A, the design layout 402 includes patterns 404, 406, and 408. In some alternative embodiments, the pattern 404 may be a main feature and the patterns 406 and 408 are assist features. Referring now to FIG. 4B, after receiving the layout 402 (i.e., step 302 in method 300 of FIG. 3), the DPU 202 determines that the layout 402 includes a first sub-polygon 414, a second sub-polygon 426 and an associated scanning path 436 in order to write (part of) the pattern 402 on the target material, and a third sub-polygon 428 and an associated scanning path 438 in order to write (part of) the pattern 402 on the target material. Accordingly, the continuous writing 136 may be used by the DPU 202 and/or the EXU 204 to write the determined patterns (i.e., 414, 426, 436, 428, and 438) on the target material. In some embodiments, while writing the first sub-polygon 414, a first writing instruction (e.g., a dosage of the beam 208) may be used by the EXU 204; while writing the second-sub polygon 426 and the associated scanning path 436, a second writing instruction (e.g., a dosage of the beam 208 and a moving velocity and/or direction of the deflector 216) may be used by the EXU 204; while writing the third-sub polygon 428 and the associated scanning path 438, a third writing instruction (e.g., a dosage of the beam 208 and a moving velocity and/or direction of the deflector 216) may be used by the EXU 204. That is the first, second, and third writing instructions may be different in dosage of the beam 208 and moving velocity and/or direction of the deflector 216. Still further, in other embodiments the one or more of the first, second, and third writing instructions may be the same in dosage of the beam 208 and moving velocity and/or direction of the deflector 216. Further, between each transition of the different instructions (e.g., the second and third instructions), the beam 208 may be turned off so as to apply a new instruction to the EXU 204. As such, to write the pattern 402, the energized beam 208 may be turned on/off three times, that is, turning on to write the first sub-polygon 414, turning off and on to write the second sub-polygon 426 and scanning path 436, and turning off and on to write the third sub-polygon 422 and scanning path 438.

Figure 5A:
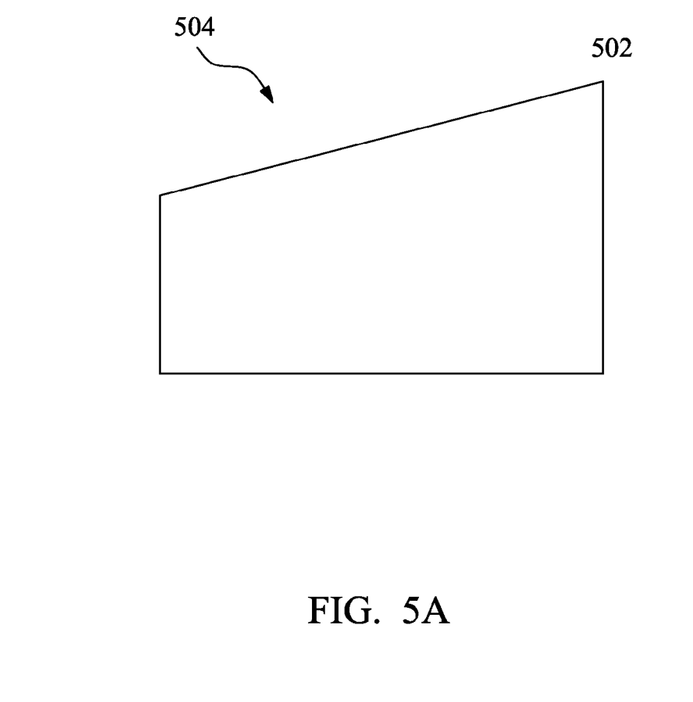
FIGS. 5A and 5B illustrate an integrated circuit (IC) design layout constructed in accordance with some embodiments.
Figure 5B:
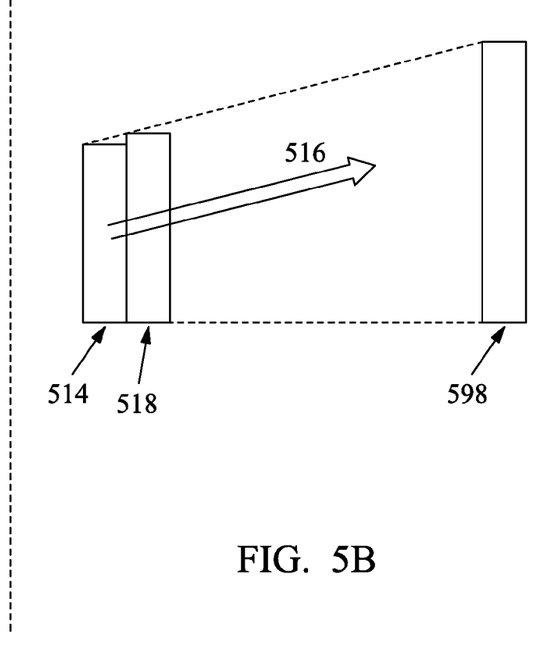

Referring to FIGS. 5A-B, an exemplary design layout 502 received by the DPU 202 and an approach to write the design layout 502 on a target material are provided in accordance with various embodiments. As shown in FIG. 5A, the design layout 502 includes a main pattern 504. In accordance with various embodiments, in FIG. 5B, after receiving the layout 502, the DPU 202 determines a first sub-polygon 514 by slicing the first sub-polygon 514 out of the main pattern 504, a second sub-polygon 518 that is directed by a scanning path 516, and up to a final sub-polygon 598 that is directed by the scanning path 516. In the illustrated embodiment, the scanning path 516 may be used merely for a directing purpose. Accordingly, the continuous writing 136 may be used by the DPU 202 and/or the EXU 204 to write the determined patterns (e.g., 514, 518, and 598) on the target material. In some embodiments, while writing the first sub-polygon 514, a first writing instruction (e.g., a dosage of the beam 208) may be used by the EXU 204; while writing the second-sub polygon 518, a second writing instruction (e.g., a dosage of the beam 208 and a moving velocity and/or direction of the deflector 216) may be used by the EXU 204; while writing the final sub-polygon 598, a third writing instruction (e.g., a dosage of the beam 208 and a moving velocity and/or direction of the deflector 216) may be used by the EXU 204. That is the first, second, and third writing instructions may be different in dosage of the beam 208 and moving velocity and/or direction of the deflector 216. Still further, in other embodiments the one or more of the first, second, and third writing instructions may be the same in dosage of the beam 208 and moving velocity and/or direction of the deflector 216. Further, between each transition of the different instructions (e.g., the second and third instructions), the beam 208 is not turned off since a new instruction may be dynamically updated to the EXU 204. As such, to write the pattern 504, the energized beam 208 may only be turned on/off one time.

Unlike conventional methods and/or systems of writing/generating an IC design layout on a substrate (e.g., a photomask or a wafer) that requires a shot-and-stop process, the present disclosure advantageously provides systems and methods to continuously write an IC design layout on a substrate with a minimum number of shot-and-stop process by determining a plurality of sub-polygons and a scanning path associated with each of the plurality of sub-polygons to write part of the IC design layout on the substrate. The advantages include reducing energy consumption of the energized beam, reducing time consumption to write a pattern, and such advantages may in turn increase fidelity of a written pattern.

The present disclosure provides an embodiment of a method for writing an IC design layout onto a substrate. The method includes receiving a pattern layout of an integrated circuit (IC); slicing a first sub-polygon out of the pattern layout; writing the first sub-polygon onto the substrate using a beam with a first beam setting that is associated with the first sub-polygon; slicing a second sub-polygon out of the remaining pattern layout that does not include the first sub-polygon, wherein the second sub-polygon interfaces with the first sub-polygon on at least one edge; and without turning off the beam after writing the first sub-polygon onto the substrate, writing the second sub-polygon onto the substrate with a second beam setting that is associated with the second sub-polygon.

The present disclosure provides another embodiment of a method for writing an IC design layout onto a substrate. The method includes receiving a pattern layout of an integrated circuit (IC); determining a first sub-polygon and a first scanning path according to the pattern layout; writing, by a beam with a first beam setting, the first sub-polygon onto the substrate; and without turning off the beam after writing the first sub-polygon onto the substrate, writing by the beam, the first scanning path onto the substrate.

The present disclosure provides yet another embodiment of a method for writing an IC design layout onto a substrate. The method includes receiving a pattern layout of an integrated circuit (IC); determining a first sub-polygon and a first scanning path according to the pattern layout; writing, by a beam with a first beam setting, the first sub-polygon onto the substrate; without turning off the beam after writing the first sub-polygon onto the substrate, writing by the beam, the first scanning path onto the substrate; determining a second sub-polygon and a second scanning path according to the pattern layout; writing, by the beam with a second beam setting, the second sub-polygon onto the substrate; and without turning off the beam after writing the second sub-polygon onto the substrate, writing, by the beam with the second beam setting, the second scanning path onto the substrate.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
   receiving a pattern layout of an integrated circuit (IC) containing a feature;
   dividing the feature into a first sub-polygon and a second sub-polygon arranged along a scanning path, wherein:
      the first sub-polygon and the second sub-polygon differ from each other in size in a first direction and in a second direction perpendicular to the first,
      the first sub-polygon interfaces with the second sub-polygon along an edge, and
      the scanning path is oblique to the edge;
   writing the first sub-polygon onto a substrate using a beam with a first beam setting that is associated with the first sub-polygon; and
   without interrupting the beam reaching the substrate after writing the first sub-polygon onto the substrate, writing the second sub-polygon onto the substrate by directing the beam along the scanning path, wherein the writing of the second sub-polygon is performed with a second beam setting that is associated with the second sub-polygon.

2. The method of claim 1, wherein the feature is a first feature, the method further comprising:
   dividing a second feature of the pattern layout into a plurality of sub-polygons; and
   without turning off the beam, sequentially writing each of the plurality of sub-polygons onto the substrate with a beam setting that is associated with each of the plurality of sub-polygons thereby forming the pattern layout onto the substrate.

3. The method of claim 2, wherein the sequentially writing each of the plurality of sub-polygons includes deflecting the beam continuously.

4. The method of claim 1, wherein the first beam setting and the second beam setting each include at least one of: a dosage of the beam, a moving velocity of the beam, and a moving direction of the beam.

5. The method of claim 1, wherein the pattern layout includes a main feature pattern to form the integrated circuit (IC).

6. The method of claim 5, wherein the pattern layout further includes an optical proximity correction (OPC) feature enclosing the main feature.

7. The method of claim 1, wherein the beam includes at least one of: electron-beam (e-beam), ion-beam, and radiation beam.

8. A method comprising:
   receiving a pattern layout of an integrated circuit (IC) that includes a feature;
   dividing the feature into a first shape and a second shape, wherein the first shape and the second shape differ from each other in size in a first direction and in a second direction perpendicular to the first;
   writing, by a beam with a first beam setting, the first shape onto the substrate; and
   without interrupting the beam reaching the substrate after writing the first shape onto the substrate, writing by the beam, the second shape onto the substrate.

9. The method of claim 8, wherein the substrate includes either a photolithography mask or a wafer.

10. The method of claim 8, wherein the beam includes at least one of: electron-beam (e-beam), ion-beam, and radiation beam.

11. The method of claim 8, wherein the pattern layout includes an optical proximity correction (OPC) contour.

12. The method of claim 8, wherein the pattern layout includes an assist feature.

13. A method comprising:
   receiving a pattern layout of an integrated circuit (IC) that includes a first feature and a second feature;
   determining a first shape and a second shape for the first feature according to the pattern layout, wherein the first shape and the second shape differ from each other in size in a first direction and in a second direction perpendicular to the first;
   writing, by a beam with a first beam setting, the first shape onto the substrate;
   without interrupting the beam reaching the substrate after writing the first shape onto the substrate, writing by the beam, the second shape onto the substrate;
   determining a third shape and a second scanning path for the second feature according to the pattern layout, wherein the third shape is from a group consisting of: a trapezoid, a triangle, a pentagon, a hexagon, a heptagon, an octagon, and a nonagon;
   writing, by the beam with a second beam setting, the second shape onto the substrate; and
   without turning off the beam after writing the second shape onto the substrate, writing, by the beam with the second beam setting, the second scanning path onto the substrate.

14. The method of claim 13, wherein the substrate includes either a photolithography mask or a wafer.

15. The method of claim 13, wherein the beam includes at least one of: electron-beam (e-beam), ion-beam, and radiation beam.

16. The method of claim 15, wherein the scanning path is curvilinear.

17. The method of claim 15, wherein each of the first sub-polygon and the second sub-polygon are from a group consisting of: a trapezoid, a triangle, a pentagon, a hexagon, a heptagon, an octagon, and a nonagon.

* * * * *